(12) United States Patent
Maruyama et al.

(10) Patent No.: US 7,355,421 B2
(45) Date of Patent: Apr. 8, 2008

(54) SEMICONDUCTOR APPARATUS TESTING ARRANGEMENT AND SEMICONDUCTOR APPARATUS TESTING METHOD

(75) Inventors: Shigeyuki Maruyama, Kawasaki (JP); Yoshikazu Arisaka, Kawasaki (JP); Kazuhiro Tashiro, Kawasaki (JP); Takayuki Katayama, Kawasaki (JP); Tetsu Ozawa, Kawasaki (JP); Yuushin Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/339,826

(22) Filed: Jan. 26, 2006

(65) Prior Publication Data

US 2007/0096761 A1    May 3, 2007

(30) Foreign Application Priority Data

Oct. 31, 2005  (JP) ............................. 2005-315995

(51) Int. Cl.
*G01R 31/02* (2006.01)
*G01R 31/26* (2006.01)
*G06K 5/04* (2006.01)

(52) U.S. Cl. .................. 324/754; 324/765; 714/700
(58) Field of Classification Search .............. 324/765, 324/754, 158.1, 761, 762; 714/700
See application file for complete search history.

(56) References Cited

U.S. PATENT DOCUMENTS

| | | | | |
|---|---|---|---|---|
| 4,649,339 A | * | 3/1987 | Grangroth et al. | 324/537 |
| 4,799,009 A | * | 1/1989 | Tada et al. | 324/756 |
| 4,961,052 A | * | 10/1990 | Tada et al. | 324/754 |
| 5,291,127 A | * | 3/1994 | Park et al. | 324/757 |
| 5,623,214 A | * | 4/1997 | Pasiecznik, Jr. | 324/754 |
| 5,818,249 A | * | 10/1998 | Momohara | 324/762 |
| 5,982,184 A | | 11/1999 | Hasegawa | |

FOREIGN PATENT DOCUMENTS

| | | |
|---|---|---|
| JP | 56-61136 | 5/1981 |
| JP | 9-172143 | 6/1997 |
| JP | 11-16963 | 1/1999 |
| JP | 2005-121553 A | 5/2005 |
| KR | 0328408 B1 | 7/2002 |

OTHER PUBLICATIONS

Office Action dated Nov. 24, 2006, issued in corresponding Korean Application No. 10-2006-0012916.

* cited by examiner

*Primary Examiner*—Ha Tran Nguyen
*Assistant Examiner*—Roberto Velez
(74) *Attorney, Agent, or Firm*—Westerman, Hattori, Daniels & Adrian, LLP.

(57) ABSTRACT

A semiconductor apparatus testing arrangement for testing a plurality of semiconductor devices produced on a semiconductor substrate, has a substrate on which a plurality of testing units are arranged, each unit comprising a probe needles corresponding to electrode terminals of the semiconductor device and electric conductor parts connected with the probe needles.

3 Claims, 5 Drawing Sheets

SEMICONDUCTOR APPARATUS TESTING ARRANGEMENT AND SEMICONDUCTOR APPARATUS TESTING METHOD

BACKGROUND OF THE INVENTION

1. Field of the Invention

The present invention relates to a semiconductor apparatus testing arrangement and a semiconductor apparatus testing method, and, in particular, to a semiconductor apparatus testing arrangement and a semiconductor apparatus testing method by which a plurality of enhanced and/or high-speed-operation-type semiconductor devices produced on a single semiconductor substrate (wafer) can be tested simultaneously.

2. Description of the Related Art

Along with a demand for an enhanced and/or high performance electronic apparatus, a highly-integrated, high-speed or large-capacity semiconductor apparatus (LSI circuit) is demanded for mounting on the electronic apparatus.

For this purpose, in a semiconductor device (LSI chip) included in the semiconductor apparatus, the operation speed is increased, the number of external connection terminals is increased, and also, separations among the external connection terminals are reduced. Especially in a system LSI circuit, this tendency is remarkable, and thereby, testing of the system LSI circuit with high reliability may become difficult.

On the other hand, as a common issue of a corresponding industry, it is required to simultaneously test a plurality of semiconductor devices such as the system LSI chips each having many external connection terminals, in order to maintain productivity and reduce product the costs.

Especially, to carry out testing of a plurality of semiconductor devices each having many fine external connection terminals, simultaneously in a state in which these semiconductor devices are produced on a semiconductor substrate (wafer), with high testing accuracy (for electric characteristics and mechanical contact characteristics) is one of essential issues for satisfying a demand of the expanding semiconductor apparatus market.

A test system for testing semiconductor devices has, as a basic configuration, an LSI tester body and a testing substrate (probe card). The probe card includes an opening, probe needles arranged in the opening for contacting electrode terminals of a to-be-tested semiconductor device, tester pin connecting terminals arranged on the periphery of the testing substrate, electric wires connecting between the probe needles and the tester pin connecting terminals, a power source electric conductor, a ground electric conductor and so forth.

The probe needles contact the electrode terminals of the to-be-tested semiconductor device, and in this state, pins of the LSI tester body are connected with the tester pin connecting terminals of the probe card. Thus, electric connection between the semiconductor device and the LSI tester body is made, and the semiconductor device is tested.

A plurality of semiconductor devices produced on a semiconductor substrate are tested simultaneously in the prior art. For example, Japanese Laid-open Patent Applications Nos. 56-61136 and 9-172143 disclose that, to electrodes of two laterally, longitudinally or obliquely adjacent semiconductor chips, probe needles are made to contact, and these two semiconductor chips are tested simultaneously.

In a case where two laterally or longitudinally arranged semiconductor devices (semiconductor chips) are tested simultaneously, probe needles can be easily made to contact electrodes of the two semiconductor chips, and also, lengths of electric wires led from the probe needles can be made uniform, if a direction in which the electrode terminals are arranged and a direction in which the semiconductor chips are arranged can be made coincident, for example, a direction in which the electrode terminals are arranged in a common direction as in a semiconductor storage (memory device).

Japanese Laid-open Patent Applications Nos. 11-16963 and 57-183571 disclose a configuration of a probe card provided with four mutually apart contact needle groups, and disclose that, with the use of this probe card, four semiconductor chips, located on a semiconductor substrate, to be apart by a distance corresponding to a plurality of the semiconductor chips, are tested simultaneously.

When the above-mentioned testing system is applied to test enhanced and/or high-speed-operation-type semiconductor device, a basic requirement is to shorten a transmission distance between each channel (pin) terminal of the LSI tester which is a main testing apparatus and a respective one of electrode terminals of the to-be-tested semiconductor device, and to minimize difference in the distances of the transmission circuits among the respective electrode terminals of the to-be-tested semiconductor device. This is because, an impedance increases as the length of the transmission circuit increases, and electric response degrades accordingly. Also, if difference occurs in the transmission circuit distances (wiring lengths or probe needle lengths), electric signal transmission delay (skew) occurs, and thus, temporal difference occurs in input/output timing of electric signals among the respective terminals.

In order to optimize electric characteristics of the signal transmission circuits (minimize the distances and eliminate difference therebetween), electric wires of the probe card are distributed on peripheral four sides of the semiconductor device corresponding to an arrangement of the electrode terminals of the to-be-tested semiconductor device, and are connected to contact terminals (probe terminals), respectively. By this method, minimization and uniformization of the signal transmission paths may be achieved for the respective electrode terminals of the to-be-tested semiconductor device. For a case where the single semiconductor device is tested, this manner is advantageous.

However, for a case where a plurality of semiconductor devices produced on a common semiconductor substrate are tested simultaneously for the purpose of improving test efficiency, the above-described manner in the prior art may be difficult to be applied. In the arts disclosed by Japanese Laid-open Patent Applications Nos. 56-61136 and 9-172143, for a case where the electrode terminals are arranged on four sides of each to-be-tested semiconductor device, probe needles should extend across the semiconductor device for contacting electrode terminals disposed in a direction perpendicular to a direction where the semiconductor devices are arranged in the proximity to a boundary between the adjacent semiconductor devices. Accordingly, the length of the probe needles should be necessarily longer than those of the other probe needles.

Further, at the boundary portion of the adjacent semiconductor devices, the probe needles for the electrode terminals arranged in the direction perpendicular to the direction in which the semiconductor devices are arranged extend across the semiconductor device, and also, are led in the same direction, in parallel, and in close proximity to the probe needles contacting the opposite electrode terminals of the same to-be-tested semiconductor devices. Accordingly, a density of these probe needles increases at a position at which the probe needles are led out, which results in increase in stray capacitance between the probe needles. As a result, in such a probe needle arranging and leading manner, the above-mentioned requirements for low impedance and optimization (minimum and uniform distances) of the transmission circuits may be difficult to achieve.

The needles provided in the probe card may be made to simultaneously contact for two obliquely adjacent semiconductor chips from a corner of these semiconductor chips, for testing the two semiconductor chips. In this manner, probe needles can be prevented from extending across the semiconductor chips. However, also in this manner applied for the obliquely adjacent semiconductor chips, lengths of probe needles led from the four sides of the semiconductor device cannot be made uniform. Accordingly, this manner is not an ultimate solution either.

According to Japanese Laid-open Patent Application Nos. 11-16963 and 57-183571, four semiconductor devices (semiconductor chips) can be tested simultaneously. However, no specific plan is disclosed for a specific manner of leading electric wires from the four contact needle (probe needle) groups, drawing electric wires for the tester pin connecting terminals, and so forth. Also, no disclosure is made there for achieving simulations testing of a plurality of electric parts such as enhanced and/or high-speed-operation-type semiconductor devices.

Thus, in the prior arts, nothing is taught for simultaneously testing a plurality of semiconductor devices each having electrode terminals on four sides thereof provided on a common semiconductor substrate with signal transmission paths kept with low impedance and having substantially equal lengths, led from these to-be-tested semiconductor devices.

SUMMARY OF THE INVENTION

According to the present invention, a probe card for testing a plurality of semiconductor devices produced on a common semiconductor substrate includes a substrate on which a plurality of testing units are arranged, each unit including probe needles corresponding to electrode terminals of the semiconductor device and electric conductors connected with the probe needles, or a semiconductor apparatus testing method for testing a plurality of semiconductor devices produced on a common semiconductor substrate simultaneously, uses a substrate on which a plurality of testing units are arranged, each unit including probe needles corresponding to electrode terminals of the to-be-tested semiconductor device and electric conductors connected with the probe needles.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENTS

According to the present invention, a probe card for testing a plurality of semiconductor devices produced on a common semiconductor substrate includes a substrate on which a plurality of testing units are arranged, each unit including probe needles corresponding to electrode terminals of the semiconductor device and electric conductors connected with the probe needles, or a semiconductor apparatus testing method for testing a plurality of semiconductor devices produced on a common semiconductor substrate simultaneously, uses a substrate on which a plurality of testing units are arranged, each unit including probe needles corresponding to electrode terminals of the to-be-tested semiconductor device and electric conductors connected with the probe needles.

In this configuration, for a plurality of (for example, four) semiconductor devices produced on a common semiconductor substrate, testing can be carried out simultaneously with testing performance equivalent to a case where a single semiconductor device is tested.

Accordingly, testing of an enhanced and/or high-speed-operation-type semiconductor device or such can be carried out efficiently, and improvement in semiconductor device productivity and reduction in manufacturing costs can be achieved.

Below, electronic component testing arrangement and testing method according to the present invention will now be described in details in a form of embodiments. According to the present invention, an opening corresponding to a to-be-tested semiconductor device and probe needles disposed in the opening, as well as power source conductors, ground electric conductors and signal wiring conductors, corresponding to the probe needles, i.e., connected to any ones of the probe needles, are provided in a testing unit. As a basic configuration, the plural number of (for example, four of) the testing units are electrically separately mounted on a probe card substrate, which number corresponds to the number of to-be-tested semiconductor devices to be tested simultaneously in this arrangement. That is, the signal wiring conductors, the power source electric conductors and the ground electric conductor, except specific part of the ground electric conductors, are not shared with another testing unit basically.

Figure 1:
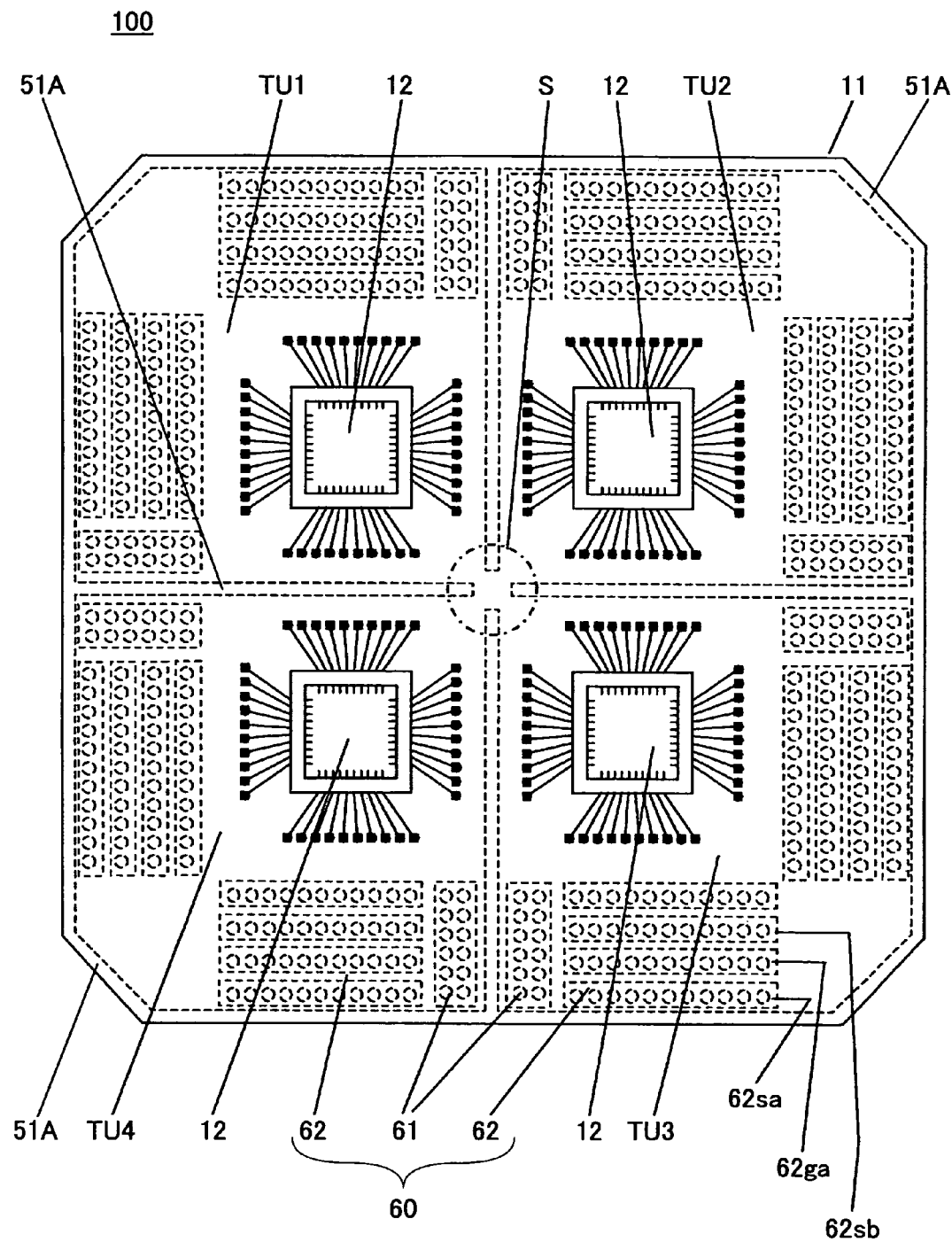
FIG. 1 shows a plan view illustrating a configuration of a probe card in a testing arrangement according to the present invention.
Figure 2:
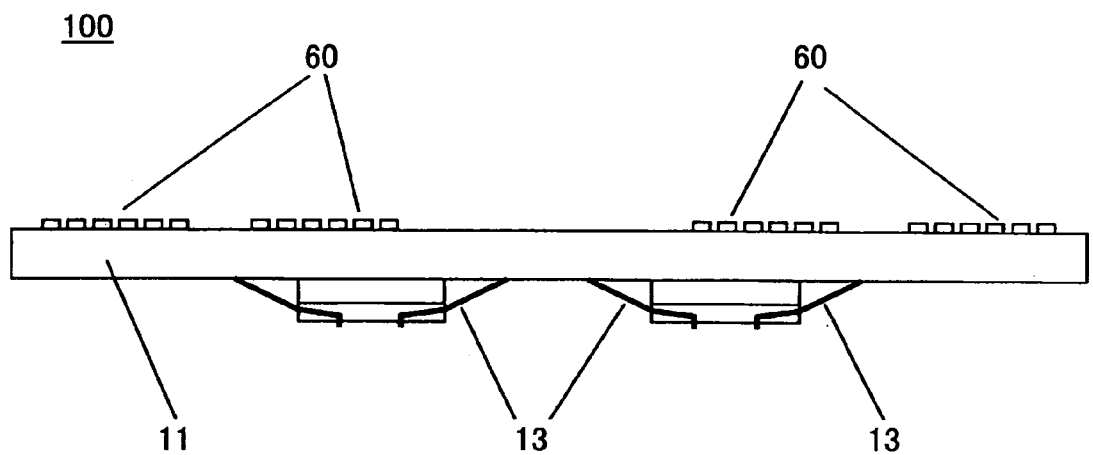
FIG. 2 shows a side elevational view illustrating the configuration of the probe card in the testing arrangement according to the present invention.
Figure 3:
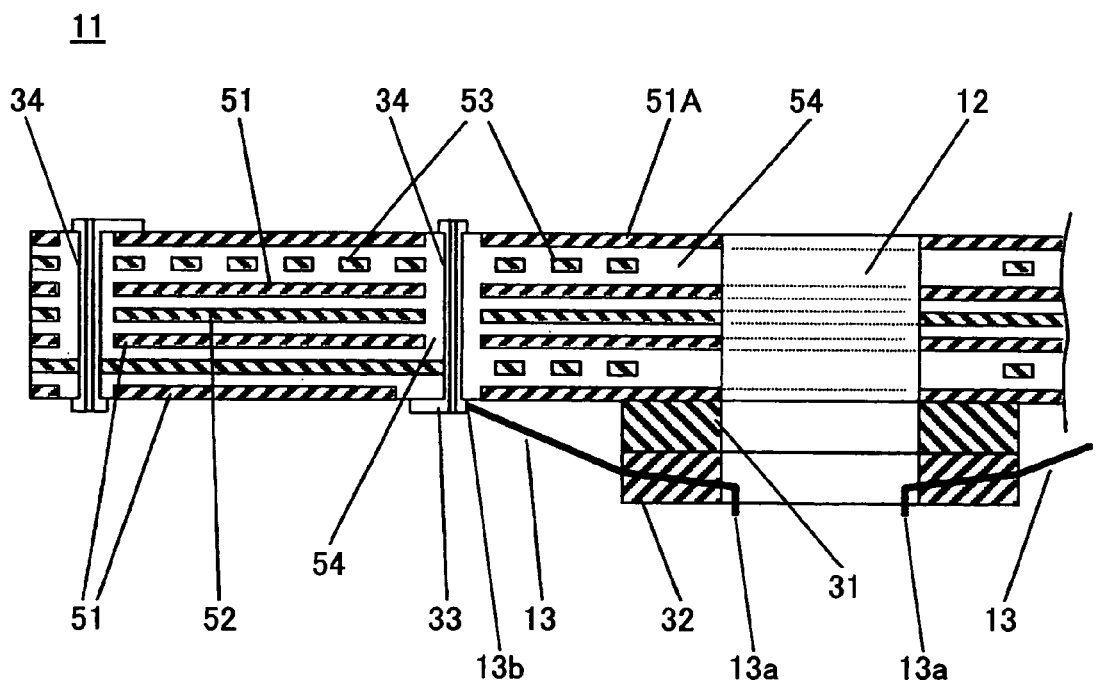
FIG. 3 shows a sectional view illustrating an essential part of the configuration of the probe card in the testing arrangement according to the present invention.

FIG. 1 shows a surface of a probe card (testing substrate) in a testing arrangement according to the present invention on which probe needles are disposed, i.e., the surface facing a to-be-tested semiconductor substrate. FIG. 2 diagrammatically shows a side surface of a part of the probe card. FIG. 3 shows a sectional view of an essential part of the configuration shown in FIG. 1.

In the probe card (testing substrate) 100 shown in FIG. 1, the four testing units TU1 through TU4 are disposed on a probe card substrate 11. The probe card substrate 11 has a multilayer interconnection structure including interlayer insulating material made of glass epoxy resin and a plurality of electric conductors made of copper (Cu) disposed on an obverse surface, a reverse surface and the inside of the insulating material.

FIG. 3 shows this multilayer interconnection structure which is an essential part of the probe card substrate 11. This multilayer interconnection structure includes signal wiring electric conductors, the power source electric conductors and ground electric conductors. These signal wiring electric conductors, power source electric conductors and ground electric conductors are provided for each testing unit, and the respective testing units are separated from each other in an electrically insulating manner.

In each testing unit, a rectangular opening 12 is provided to pass through the probe card substrate 11. This rectangular opening 12 corresponds to a to-be-tested semiconductor device produced on a common semiconductor substrate to be tested. These rectangular openings 12 are provided in such a manner that they are apart from each other among the respective testing units by separations so wide as to extend across or jump a plurality of (for example, 2, 3, or such) semiconductor devices. The number of semiconductor devices thus jumped by the separation may be appropriately selected. It is noted that the shape of the opening 12 should be selected corresponding to a shape of or an arrangement of electrode terminals of the to-be-tested electronic component, and is not limited to the 'rectangle' as in the present embodiment.

Further, such a configuration that the opening 12 is provided to pass through the probe card substrate 12 also appears in the prior art. However, an arrangement of such an opening is not essential in the present invention. That is, for a case where improvement of mechanical strength or heat durability is required, such an opening may be omitted, or, even such an opening is provided, this may be filled with metal or such via insulating material, or such. Thus, the present invention may also be embodied as a probe card substrate substantially having no such an opening.

In the rectangular opening 12 of the testing unit, a plurality of probe needles 13 are provided in an inclined manner so that one end 13a of the probe needles 13 may contact the electrode terminals of the to-be-tested semiconductor device, from a first main surface (i.e., a surface facing the to-be-tested semiconductor device) of the probe card substrate 11, on each of four sides of the opening 12. The number and mutual separations of these probe needles 13 are set to correspond to an actual arrangement of the electrode terminals of the to-be-tested semiconductor device.

The probe needles 13 are made of tungsten (W), and, as shown in FIG. 3, the probe needles 13 are fixed on a ceramic frame 31 disposed on the periphery of the opening 12 of the probe card substrate 11 by resin material 32, and the other ends 13b of the probe needles are fixed and connected to terminal parts 33 disposed on the probe card substrate 11 in a soldering method or such. Then, from the terminal parts 33, electric connection is made to respective pin connecting terminal parts 60 through respective ones of the ground electric conductors 51, the power source electric conductors 52 and the signal wiring electric conductors 53, as well as interlayer connecting vias 34.

On both sides, i.e., obverse and reverse sides of the probe card substrate 11, the ground electric conductors 51 are provided in a form of a plane, except the connecting terminal parts 60 for the signal wiring conductors and the power source electric conductors.

Further, as intermediate layers of the probe card substrate 11, the above-mentioned power source electric conductors 52 and the signal wiring electric conductors 53 are disposed alternately in a thickness direction between the ground electric conductors 51 respectively via insulating material 54, for each testing unit. The ground electric conductors 51 are provided in a form of a plane also between the power source electric conductors 52 and the signal wiring electric conductor 53 via the insulating material 54, and thereby, influence of noise or such to the signal wiring electric conductors 53 from the power source electric conductors 52 is avoided.

The ground electric conductors 51 are disposed appropriately between the signal wiring electric conductors 53 in same layers. Thereby, in corporation with the ground electric conductors 51 disposed in the above and below layers as mentioned above, the signal wiring electric conductors are surrounded thereby. As a result, mutual interference between the respective signal wiring electric conductors is avoided. The ground electric conductors thus laminated in a plurality of layers are mutually connected by means of interlayer connecting vias 34 in a laminating direction (thickness direction). Such interconnection is made for each testing unit.

Only the ground electric conductors 51A provided on a second main surface (opposite to the above-mentioned first main surface facing the to-be-tested semiconductor device) of the probe card substrate 11 are mutually connected at a central part (shown as a circle 'S' of FIG. 1) of the probe card substrate 11 among the respective testing units.

It is noted that FIG. 1 shows the surface on which the probe needles 13 are provided, i.e., the first main surface facing the to-be-tested semiconductor device. In FIG. 1, the ground electric conductors disposed on the first main surface and the intermediate layers are not shown, but the ground electric conductors 51A disposed on the second main surface of the probe card substrate 11 and pin connecting parts (described later) are shown by broken lines. That is, as shown in FIG. 1, at a position furthest from the to-be-tested semiconductor device which the probe needles 13 contact, the ground electric conductors 51A are electrically connected, and thus, a ground electric potential of the entire probe card 11 is made common.

Figure 4:
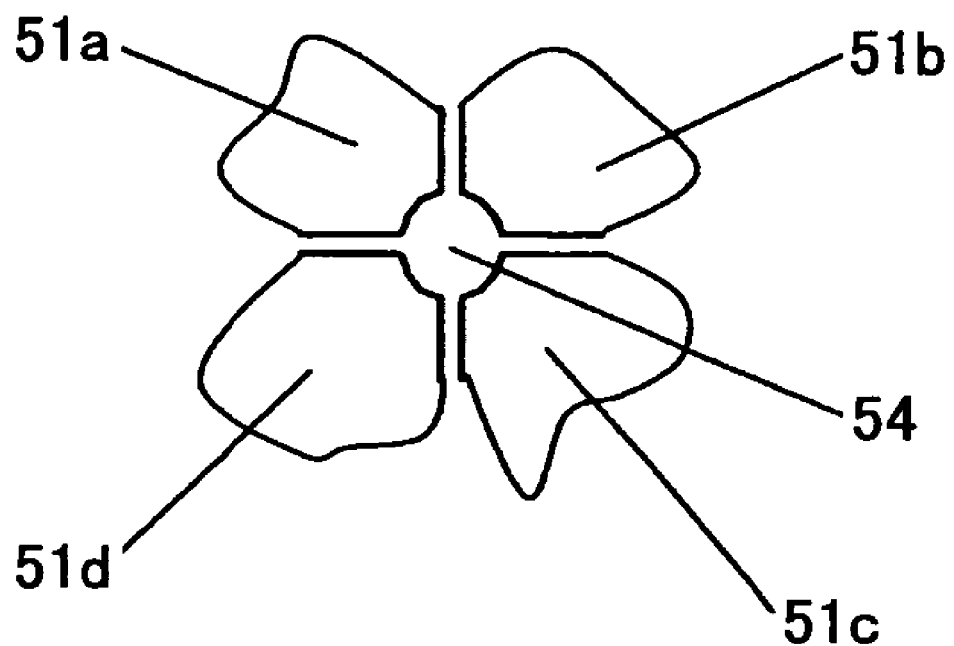
FIG. 4 shows a plan view illustrating an essential part of a configuration of a ground electric conductor in the probe card of the testing arrangement according to the present invention.

By these arrangements and connection of the ground electric conductors, a possibility that noise, which may be generated in one of the to-be-tested semiconductor devices, affects the other to-be-tested semiconductor devices of the corresponding testing units, can be made very low. It is noted that the ground electric conductors 51, disposed on the layers other than the top layer of the second main surface (i.e., the surface opposite to the first main surface facing the to-be-tested semiconductor device) of the probe card substrate 11, are separated from each other among the respective testing units, even at a central part of the probe card substrate 11, as shown in FIG. 4 (FIG. 4 shows a portion corresponding to the central circle 'S' of FIG. 1).

Further, the power source electric conductors 52 are selectively widened so that the power source electric conductors 52 may have a wide pattern as much as possible in each wiring layer (not shown).

On the second main surface (opposite to the first main surface facing the to-be-tested semiconductor device) of the probe card substrate 11, except areas in which the ground electric conductors 51A are disposed, the pin connecting terminal parts 60 are disposed in a manner that they are electrically insulated from the ground electric conductors 51A (see FIG. 1).

To the pin connecting terminal parts 60, testing terminals (not shown) extending from an LSI tester body or such upon testing are connected, and therewith, power supply, testing signal input/output, and so forth are carried out. Therefore, the pin connecting terminal parts 60 are disposed in the proximity to the periphery of the probe card substrate 11. The pin connecting terminal parts 60 are divided into power supply terminal parts 61 and testing signal parts 62 corresponding to respective electrodes/terminals of the LSI tester body, each part including a plurality of terminals.

In the power source terminal parts 61, to four rows of terminals from the periphery of the probe card substrate 11, the testing terminals extending from the LSI tester body are connected. Fifth and sixth rows of terminals from the periphery of the probe card substrate 11 are connected with the above-mentioned four rows of terminals via internal electric conductors, and thereto, other electric wires may be connected. Instead, all the terminals of the power source terminal parts 61 may be configured to have the testing terminals extending from the LSI tester body connected thereto. Such a configuration may be applied for a case where power source enhancement layers (described later) should not be provided.

In the testing terminal parts 62, a ground electric potential terminal row 62ga are provided between one testing signal terminal row sa and another testing signal terminal row sb. It is noted that, in FIG. 1, a terminal row disposed inside of, i.e., on the side of the opening 12 of the testing signal terminal row sb, is also a ground electric potential terminal row.

In the respective testing units, the power source electric conductors, the ground electric conductors and the signal wiring electric conductors connected to the probe needles 13 are led to these pin connecting terminal parts 60 through the above-mentioned multilayer interconnection, and connected to the corresponding terminals there, respectively.

Figure 5:
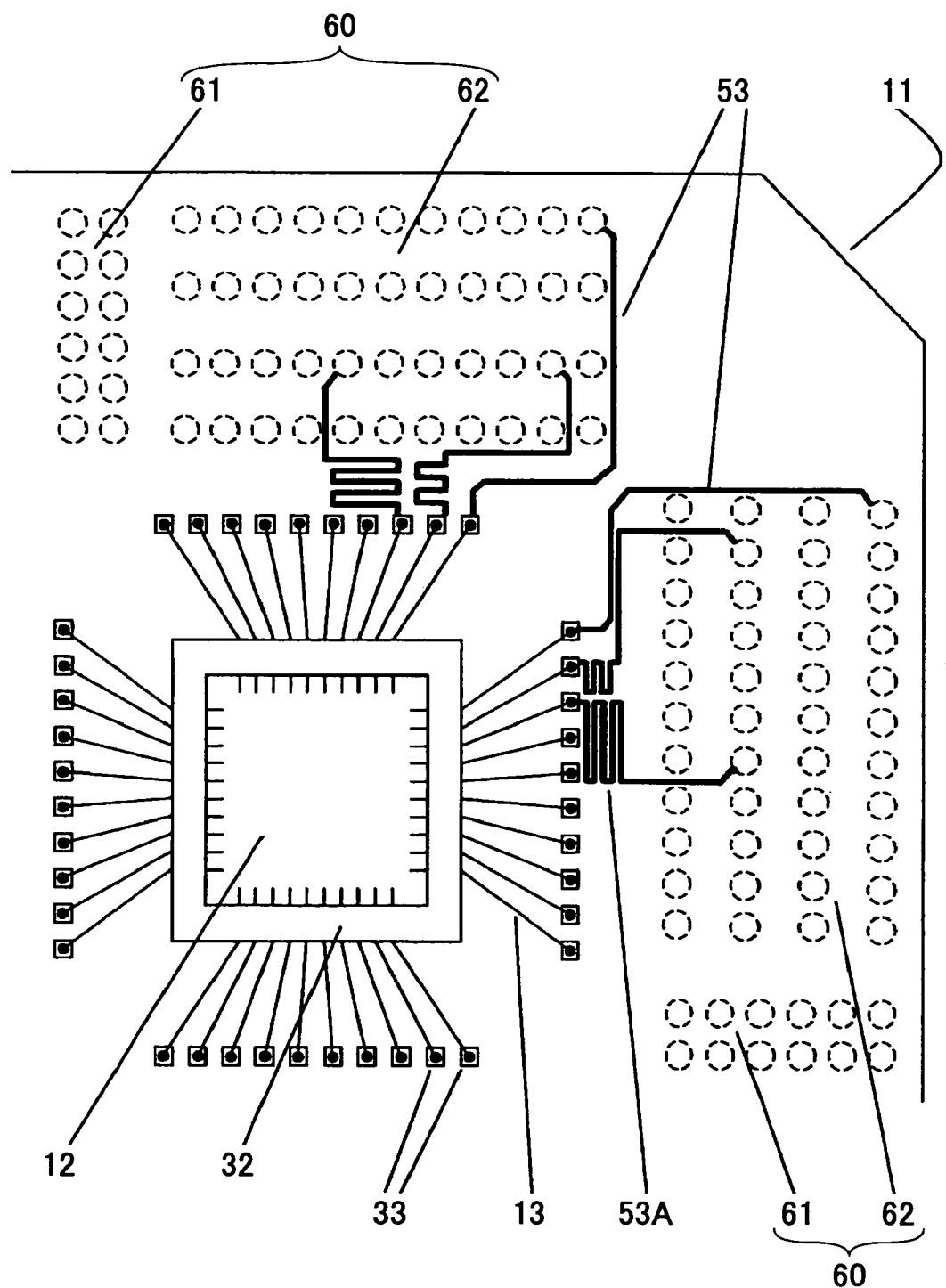
FIG. 5 shows a plan view illustrating an essential part of a configuration of signal wiring conductors in the probe card of the testing arrangement according to the present invention.

In the probe card configured as described above, distances between the respective probe needles 13 disposed on the four sides of the opening 12 to the pin connecting terminal parts 60 are mutually different corresponding to the positions and directions of these four sides, and as a result, transmission line lengths from the probe needles 13 to the pin connecting terminal parts 60 are mutually different significantly. Therefore, in the present invention, as shown in FIG. 5, the transmission line lengths of the signal wiring electric conductors 53 having short transmission lengths from the probe needles 13 to the pin connecting terminal parts 60 are lengthened as a result of these signal wiring electric conductors 53 being drawn around in U shapes as shown (53A). Thus, all the signal wiring electric conductors in one unit are made substantially equal, i.e., an equal-length wiring structure is achieved there.

On the other hand, connection between the probe needles 13 and the power source electric conductors or the ground electric conductors are made, with the use of interlayer connecting vias 34, for the power source electric conductors or the ground electric conductors located in the proximity to the terminal parts 33 to which the other ends of the probe needles 13 are connected, as shown in FIG. 3. These power source electric conductors and the ground electric conductors are made to have a wide width so that the lengths thereof cause no substantial problem.

Thus, in the testing arrangement according to the present invention, the plurality of groups of probe needles are provided in the probe card. In this configuration, for testing a plurality of to-be-tested semiconductor devices simultaneously, the power source electric conductors, the ground electric conductors and the signal wiring electric conductors, which correspond to one probe needle group, are included in each testing unit together with the probe needle group, for a respective one of the plurality of to-be-tested semiconductor devices. Further, in the single probe card, the plurality of the testing units are disposed and, optimization arrangement including the equal-length wiring arrangement is applied for the signal wiring conductors connected to the respective probe needles. Accordingly, when a plurality of to-be-tested semiconductor devices are tested simultaneously, testing in each testing unit can be carried out without affecting the other testing units. Thereby, reliability of a semiconductor device evaluated in this testing can be kept very high.

By further improving the accuracy in the arrangement of the testing units, simultaneous testing with the use of more number of (for example, six or eight) testing units disposed in the single probe card (not shown) can be carried out with equivalent high accuracy. Accordingly, testing of semiconductor devices such as enhanced and/or high-operation-speed-type semiconductors can be carried out more efficiently, and thus, improvement in productivity of the semiconductor devices and reduction in manufacturing costs thereof can be achieved.

In the embodiment shown in FIG. 1, the pin connecting terminal parts 60 are disposed in the proximity to the periphery of the probe card substrate 11 for the purpose that connection with the testing terminals extending from the LSI tester body can be made easier. Accordingly, a distance between the probe needles 13 disposed on a side of the opening located on the side of the central part of the probe card substrate 11 and the pin connecting terminal part 60 is longer than a distance between the probe needles 13 disposed on another side of the opening located on the side of the pin connecting terminal part 60 and the same pin connecting terminal part 60.

As a result, depending on a particular testing condition or such, power supply to the probe needles 13 disposed on the side of the opening 12 located on the side of the central part of the probe card substrate 11 may become insufficient in comparison to power supply to the probe needles disposed on the other side of the opening located on the side of the pin connecting terminal part 60.

Figure 6:
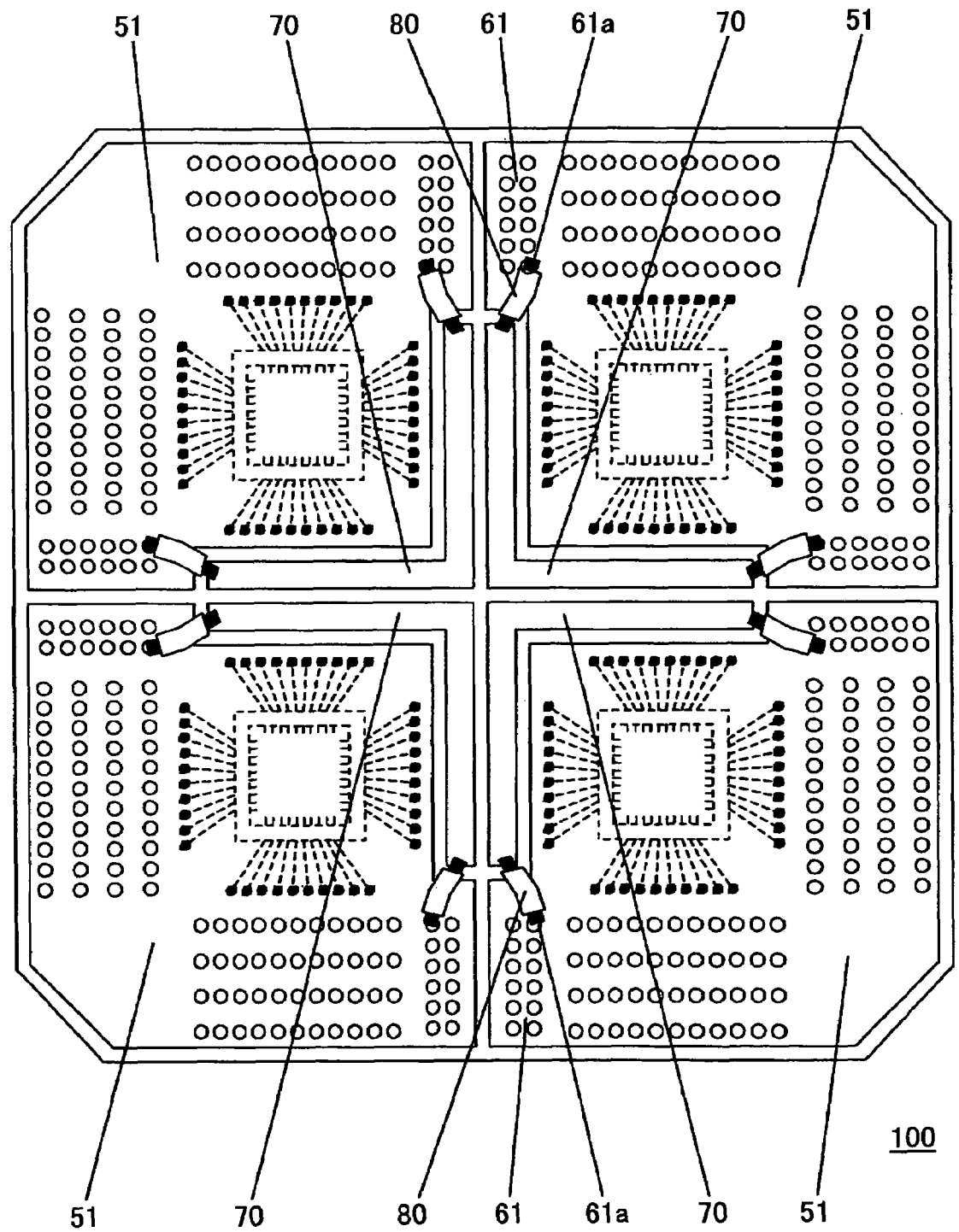
FIG. 6 shows a plan view illustrating a variant embodiment of the probe card of the testing arrangement according to the present invention.

In order to solve this problem, in another embodiment of the present invention shown in FIG. 6, the above-mentioned power source enhancement electric conductors 70 are provided along those sides of the openings located on the side of the central part of the probe card substrate 11, on the second main surface (i.e., the surface opposite to the first main surface facing the to-be-tested semiconductor device) of the probe card substrate 11, for each testing unit. Then, coated electric wires 80 are applied to connect between the power source enhancement electric conductors 70 and the power supply pin connecting terminal parts 61a. Since the above-mentioned sides of the openings continue perpendicularly, the power source enhancement electric conductors 70 are produced to extend in an L-shape, and, at the ends thereof, the power source enhancement electric conductors 70 are connected to the power supply pin connecting terminal parts 61a through the coated electric wires 80. From the power source enhancement electric conductors 70, electric connection is made to the corresponding probe needles 13 via the power source electric conductors 52 and the interlayer connecting vias 34.

By thus providing the power supply enhancement electric conductors 70, power supply to the probe needles disposed on the sides of the openings located on the side of the central part of the probe card substrate 11 can be made sufficiently therewith. As a result, testing in the respective testing units can be carried out with higher reliability when a plurality of semiconductor devices such as enhanced and/or high-speed-operation-type semiconductor devices are tested simultaneously.

For a case where an electric current capacity of the power source enhancement electric conductor 70 should be increased, a thickness of the power source enhancement electric conductors 70 may be increased or the power source enhancement electric conductors 70 may be made to have a multilayer structure. When the power source enhancement electric conductors 70 are thus provided on the second main surface (i.e. the surface opposite to the first main surface facing the to-be-tested semiconductor device) of the probe card substrate 11, connection among the testing units on the top layer, as the connection among the above-mentioned ground electric conductor 51A described above with reference to FIG. 1, is difficult.

In this case, connection among the ground electric conductors may be made in a layer inside by one layer from the first main surface of the probe card substrate 11 in such a connection manner as that of the above-mentioned connection among the ground electric conductors 51A. It is noted that the above-mentioned power source enhancement electric conductors 70 may be provided rather on the first main surface (the surface facing the to-be-tested semiconductor device) of the probe card substrate 11. In this case, the ground electric conductors 51A are provided on the second main surface (opposite to the first main surface facing the to-be-tested semiconductor device).

The testing arrangement and the testing method, described above according to the present invention are suitable for testing the enhanced and/or high-speed-operation-type semiconductor devices. However, application of the present invention is not limited thereto, and, the present invention may be applied to other general semiconductor devices, and also, to other electronic components.

Further, the present invention is not limited to the above-described embodiments, and variations and modifications may be made without departing from the basic concept of the present invention claimed below.

The present application is based on Japanese Priority Application No. 2005-315995, filed on Oct. 31, 2005, the entire contents of which are hereby incorporated herein by reference.

What is claimed is:

1. A testing apparatus for testing a plurality of semiconductor devices produced on a semiconductor substrate, comprising: a substrate in which a plurality of testing units are arranged, each unit including probe needles corresponding to electrode terminals of the semiconductor device and electric conductors connected to said probe needles, and pin connecting parts connected to said electric conductors and having different distances from said respective probe needles, wherein: each testing unit has a rectangular opening part; the probe needles are arranged on four sides of the rectangular opening part; and power source electric conductors are provided among the respective testing units; and the electric conductors have mutually equal lengths from the probe needles to the pin connecting parts.

2. The testing apparatus as claimed in claim 1, wherein:
the rectangular opening parts of the respective testing units are arranged in such a manner that the rectangular opening parts are mutually apart by a distance corresponding to N (integer) of the to-be-tested semiconductor devices.

3. The semiconductor apparatus testing arrangement as claimed in claim 1, wherein:
in the substrate, a ground electric conductor is provided between the respective testing units.

* * * * *